(12) United States Patent
Vergnes et al.

(10) Patent No.: US 7,739,539 B2
(45) Date of Patent: Jun. 15, 2010

(54) READ-DATA STAGE CIRCUITRY FOR DDR-SDRAM MEMORY CONTROLLER

(75) Inventors: Alain Vergnes, Trets (FR); Eric Matulik, Meyreuil (FR)

(73) Assignee: Atmel Corporation, San Jose, CA (US)

( * ) Notice: Subject to any disclaimer, the term of this patent is extended or adjusted under 35 U.S.C. 154(b) by 498 days.

(21) Appl. No.: 11/549,458

(22) Filed: Oct. 13, 2006

(65) Prior Publication Data

US 2008/0091903 A1    Apr. 17, 2008

(51) Int. Cl.
*G06F 1/04* (2006.01)
(52) U.S. Cl. .................. 713/600; 713/500; 711/105; 711/167; 365/189.01; 365/193
(58) Field of Classification Search .................. 713/500, 713/600; 711/105, 167; 365/189.01, 193
See application file for complete search history.

(56) References Cited

U.S. PATENT DOCUMENTS 6,782,459 B1 *  8/2004  Ware ........................ 711/167
7,313,715 B2 * 12/2007  Yoo et al. .................. 713/500

2005/0138277 A1  6/2005  Koo
2006/0230250 A1  10/2006  Klint et al.

FOREIGN PATENT DOCUMENTS

WO    WO-2008/048835 A1    4/2008

OTHER PUBLICATIONS

"International Application No. PCT/US07/80934, International Search Report mailed Mar. 7, 2008", 2 pgs.
"International Application No. PCT/US07/80934, Written Opinion mailed Mar. 7, 2008", 3 pgs.

* cited by examiner

*Primary Examiner*—Thuan N Du
(74) *Attorney, Agent, or Firm*—Schwegman, Lundberg Woessner, P.A.

(57) ABSTRACT

A circuit for sampling data from a memory device comprises a circuit for providing a clock signal to the memory device, a data bus carrying data at twice the rate of the clock signal, a circuit for providing a control signal to indicate the period of time where data are valid, and a set of registers whose content is triggered by both edges of a signal resulting from the delay of the control signal. The set of registers is divided into several sub-parts, each sub-part loading the value of the data bus carrying data provided by the memory device at a period being an integer multiple of the clock signal where the sampling point is different for each sub-part.

16 Claims, 12 Drawing Sheets

1st sampling point:
D0D1 is the first data read by CPU

READ-DATA STAGE CIRCUITRY FOR DDR-SDRAM MEMORY CONTROLLER

BACKGROUND OF THE INVENTION

1. Field of the Invention

The present invention relates to DDR memory devices. More particularly, the present invention relates to read data stage circuitry architecture for Mobile DDR memory device controllers.

2. The Prior Art

DDR-SDRAM devices can transfer data twice as fast as regular SDRAM chips (SDR-SDRAM). This is because DDR-SDRAM devices can send and receive signals twice per clock cycle. Mobile DDR-SRAM devices are a kind of DDR memory device designed for low-power consumption. Their intrinsic timings for read accesses slightly differs from that of standard DDR memory devices.

FIG. 1 is a block diagram that shows a typical microcontroller system architecture 10 employing a microprocessor 12 connected to a DDR-SDRAM device 14. Conventional Crystal oscillators can generate frequencies up to 30 MHz. To obtain clock frequencies of 100 Mhz and higher for use by the microprocessor 12 and the system bus, there is a need to employ phase-locked loop (PLL) circuitry. The system clock may be generated from the main oscillator and PLL 16 that can be found in a microprocessor circuit. The main oscillator and PLL circuitry 16 is used to multiply the frequency produced by the crystal oscillator. If the microprocessor circuit 12 drives a DDR memory device 14, a DDR-SDRAM memory controller 18 must be used and this module requires DQS-delay circuitry 20 to delay DQS signals 22 and 24 from DDR-SDRAM memory for read operations.

If the system bus (26, 28, and 30) and microprocessor 12 (also known as CPU) are clocked at 100 MHz, then any write access to DDR memory controller 18 will require the PLL 16 to be configured at 200 MHz for the DDR-SDRAM controller 18 to align the data with the waveforms shown in FIG. 3. This may be performed by logic within the DDR-SDRAM controller 18 that is clocked at 2× frequency of the main clock frequency of the DDR-SDRAM controller 18.

In order to drive the microprocessor 12 and system bus (26, 28, and 30) and main logic of the DDR-SDRAM controller module at 100 MHz, a divide-by-2 circuit 32 is used to derive the 100 MHz system clock 34 from the 200 MHz PLL output. This clock is gated and supplied to the DDR-SDRAM memory device 14 on clock line 36.

The DDR-SDRAM controller 18 drives the DDR-SDRAM memory device 14 through buffers 38. The propagation delay for each buffer is assumed to be the same for simplicity purposes. In real-life the delay for each buffer may be slightly different but without significant difference because buffers are high-drive buffers designed to drive DDR devices and share roughly the same capacitive load. The command signals 40 (RAS/CAS/WE/CKE) passed to the DDR-SDRAM device 14 must be aligned in such a way that a setup time and hold time is guaranteed with respect to the rising edge of the clock signal provided to the memory device on clock line 36.

For each type of memory the read data bus 42 must be properly sampled and the data must be passed to the system bus (shown as rdata 30 in FIG. 1). For proper operation, the edge of the DQS signal is delayed so that sampling occurs in the middle of the data window. Read logic 44 drives read registers 46 to accomplish this task.

Referring now to FIG. 2, a block diagram illustrates the details of an arrangement of read registers 46 that may be used to properly sample the output data from the DDR-SDRAM device 14. As is shown in FIG. 2 several internal registers are required to pass data onto the system bus. The first set of registers 48 (DataReg1) captures data D0, the second set of registers 50 (DataReg2) captures data D1. When the rising edge of the system bus clock on line 52 occurs somewhere in the window period of captured data D1, the data capture register 50 holding D1 is ready but the data capture register 48 holding D0 may no longer be holding D0 depending on the propagation delay (T1). If T1 is very low, then this capture register 48 may have already switched to the D2 value and therefore cannot provide the system bus with D0 and D1. Therefore another capture register 54 (DataReg3) samples the data captured by register 48 for each falling edge of the delayed DQS signal, using inverter 56 to invert the delayed DQS signal on line 58.

At the rising edge of the CPU clock the 32-bit data is formed by sampling both 16-bit data capture registers 50 and 54. If the propagation delay in the I/O pad providing data and clock to the DDR-SDRAM device 14 varies from 0 to half the period of the DDR clock/CPU clock, the data sampled will be correct. The data sampling circuitry is safe and robust. When read accesses are performed, data from the DDR-SDRAM device 14 must be sampled but when no access is being performed it may be useful to prevent data switching by holding the data provided to the system bus to achieve lower power consumption. This is done by providing sample-and-hold functions which consist of DFFs 60 and 62 and multiplexers 64 and 66. One input of each multiplexer recirculates the data output of the DFF to its D input. When a multi-bit signal has to be stored, this architecture is repeated for each bit of the multibit signal.

FIG. 3 illustrates the best and worst case timings (shown as T1=min and T1=max, respectively) for read accesses for a standard DDR-SDRAM memory device at a frequency of 100 MHz for a given manufacturing process, operating voltage and temperature (PVT). Both values of T1 are shorter than one-half the clock period of the DDR clock. The circuit of FIG. 2 accommodates the worst-case timing shown in FIG. 3.

FIG. 4 illustrates the best and worst-case timings for read accesses for a mobile DDR-SDRAM device at a frequency of 100 MHz for a given PVT. Compared to the timing of the standard DDR-SDRAM shown in FIG. 3, the best and worst case timings (Tacc_min and Tacc_max) for the mobile DDR-SDRAM have a larger dispersion as may be seen in FIG. 4 and are shown separately. It is seen that, at some higher frequencies, the value Tacc_max may be larger than one-half of the clock period of the DDR clock depending on the clock frequency used to clock the DDR memory device. When standard and mobile DDR-SDRAM devices may be used with a microcontroller, the user may not want to reduce the frequency of the system clock to accommodate the different memory device types. In order to obtain proper operation, the intrinsic timing differences must be accommodated at higher clock frequencies to avoid data-read errors.

Because mobile DDR-SDRAM memory devices have a large variation in propagation delay (access time), the difference in best case and worst case access time is greater than half the CPU clock period/clock sent to the DDR memory device for some range of frequencies. If it is desired to drive mobile DDR memory devices at the same CPU clock frequency used to drive standard DDR memory devices using the read data stage of FIG. 2, unpredictable behavior of read data stage circuitry may result in which it will work properly with worst-case timing but will not operate properly with best-case timing. In between best-case and worst-case timing, it is not possible to predict the point at which the circuit 46 will switch from working to non-working.

FIG. 5 is a set of timing diagrams that illustrate the operation of the circuit of FIG. 2 for a standard DDR-SDRAM memory device under best-case and worst-case timing conditions. As shown in FIG. 5, the sampling point occurs when the data in registers 50 (DataReg2), and 54 (DataReg3) is valid. The delay T1 represents the buffer delay between the internal RAS/CAS/WE/Cke signals and those signals at the external pads as well as the buffer delay between the edge of the gated clock signal at line 36 of FIG. 1 and the external clock signal input CLK to the DDR memory in FIG. 1. Delay T2 represents the delay between the edge of the DDR CLK signal to the DDR-SDRAM memory device of FIG. 1 and the delayed DQS signal from DQS delay circuit 20 of FIG. 1. T3 is the register 50 hold time. Under both the best-case and worst-case conditions, the D0 and D1 data is stable in the capture DFFs DataReg2 and DataReg3 and thus is correctly transferred to the system bus by the sampling DFFs.

FIG. 6 is a set of timing diagrams that illustrate the operation of the circuit of FIG. 2 for a mobile DDR-SDRAM memory device under worst-case conditions. FIG. 6 shows the relevant waveforms when the access time of the mobile DDR memory device is very high (7 ns), which is more than half the clock period of 5 ns. This is the worst-case access time and is essentially equivalent to the worst-case access time of a standard DDR memory device. The delay T1 represents the buffer delay between the internal RAS/CAS/WE/Cke signals and those signals at the external pads as well as the buffer delay between the edge of the gated clock signal at line 36 of FIG. 1 and the external clock signal input CLK to the DDR memory in FIG. 1. Delay T2 represents the delay between the edge of the external DDR CLK signal to the DDR-SDRAM memory device of FIG. 1 and the delayed DQS signal from DQS delay circuit 20 of FIG. 1 that occurs after the access time of the DDR-SDRAM memory device. T3 is the captured data setup time compared to the rising edge of system bus clock.

It may be seen that the basic read stage circuitry 46 of FIG. 2 behaves correctly under the timing conditions of FIG. 6. The delay T3 is greater than the setup time for a DFF or other sequential element used to capture data that will be sampled onto the system bus. As shown in FIG. 6, at the end of delay T3, the D0 and D1 data respectively stored in DataReg3 and DataReg2 is stable in the capture DFFs and thus is correctly transferred to the system bus by the sampling DFFs.

There is range of operating conditions where the circuit behavior will be unpredictable. This is shown with reference to FIG. 7, a set of timing diagrams that illustrate the operation of the circuit of FIG. 2 for a mobile DDR-SDRAM memory device under best-case conditions. FIG. 7 shows the relevant waveforms when the access time of the mobile DDR memory device is very low (2 ns), which is less than half the clock period (5 ns). Again, the delay T1 represents the buffer delay between the internal RAS/CAS/WE/Cke signals and those signals at the external pads as well as the buffer delay between the edge of the gated clock signal at line 36 of FIG. 1 and the external clock signal input CLK to the DDR memory in FIG. 1. Delay T2 represents the delay between the edge of the external DDR CLK signal to the DDR-SDRAM memory device of FIG. 1 and the delayed DQS signal from DQS delay circuit 20 of FIG. 1 that occurs after the access time of the DDR-SDRAM memory device. It will appear obvious to those skilled in the art that if T1 and the access time are very low, then data D0 and D1 will be respectively stored in DataReg3 and DataReg2 one clock cycle before the sampling point of the system bus.

Consider the DDR memory device access time constant. If the system frequency is increased, the conditions shown in FIG. 7 will exist. If the system frequency is reduced, the conditions shown in FIG. 6 will exist. While T3 is positive (i.e., greater than the DFF setup time plus the propagation delay of combinational logic that would be placed prior to drive the D input of the DFF) there is no problem. If, however, T3 is less than this value or negative as shown in FIG. 7, there is a problem. As a consequence, if the access time varies due to operating condition changes (temperature, voltage, etc.) then either a range of temperature and/or range of voltage will be forbidden or, for a given operating conditions, a clock frequency range will be forbidden. T3 is a consequence of T2 and the system clock period. Therefore such read data stage circuitry cannot be used for mobile DDR-SDRAM memory devices at some frequencies.

Consider the system clock frequency to be constant. If the DDR memory device access time plus the time T1 is increased, the conditions shown in FIG. 7 will exist. If the DDR memory device access time is reduced, the conditions shown in FIG. 6 will exist. While the DDR memory device access time plus the propagation delay of combinational logic that would be placed prior to drive the D input of the DFF plus the DFF setup time is greater than the system clock period there is no problem. On the contrary as shown in FIG. 6, there is a problem. As a consequence, if the access time varies due to operating condition changes (temperature, voltage, etc.), then either a range of temperature and/or range of voltage will be forbidden or, for given operating conditions, a range of access time will be forbidden. Therefore such read data stage circuitry cannot be used for mobile DDR-SDRAM memory devices under different operating conditions.

BRIEF DESCRIPTION OF THE INVENTION

According to the present invention, a circuit for sampling data from a memory device comprises a circuit for providing a clock signal to the memory device, a data bus carrying data at twice the rate of the clock signal, a circuit for providing a control signal to indicate the period of time where data are valid, and a set of registers whose content is triggered by both edges of a signal resulting from the delay of the control signal. The set of registers is divided into several sub-parts, each sub-part loading the value of the data bus carrying data provided by the memory device every other clock cycle (e.g., at a period being an integer multiple of the clock signal where the sampling point is different for each sub-part).

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

The architecture of the present invention is designed to extend the clock range of mobile DDR-SDRAM memory devices at frequencies where the access time value is significant compared to the system clock period. The present invention allows the controller circuitry to handle the timings provided by mobile-DDR memory devices which slightly differs from standard DDR-SDRAM memory devices.

The read data stage of the invention is capable of managing both the mobile DDR-SDRAM access time and standard DDR-SDRAM access time and provides a single controller circuitry being able to perform safe data capture for both types of memory devices. The present invention allows driving mobile DDR-SDRAM memory devices at frequencies where the access time value is close to the clock period or comprises a significant portion of the clock period. The circuitry architecture allows a safe sampling of read data bus whatever the derating factors are (PVT=Process, Voltage, Temperature) and is tolerant compared to the placement and routing of the circuitry on silicon (layout). The read data stage architecture can also be used for standard DDR-SDRAM memory device therefore the memory controller can drive both types of DDR-SDRAM memory devices.

Figure 1:
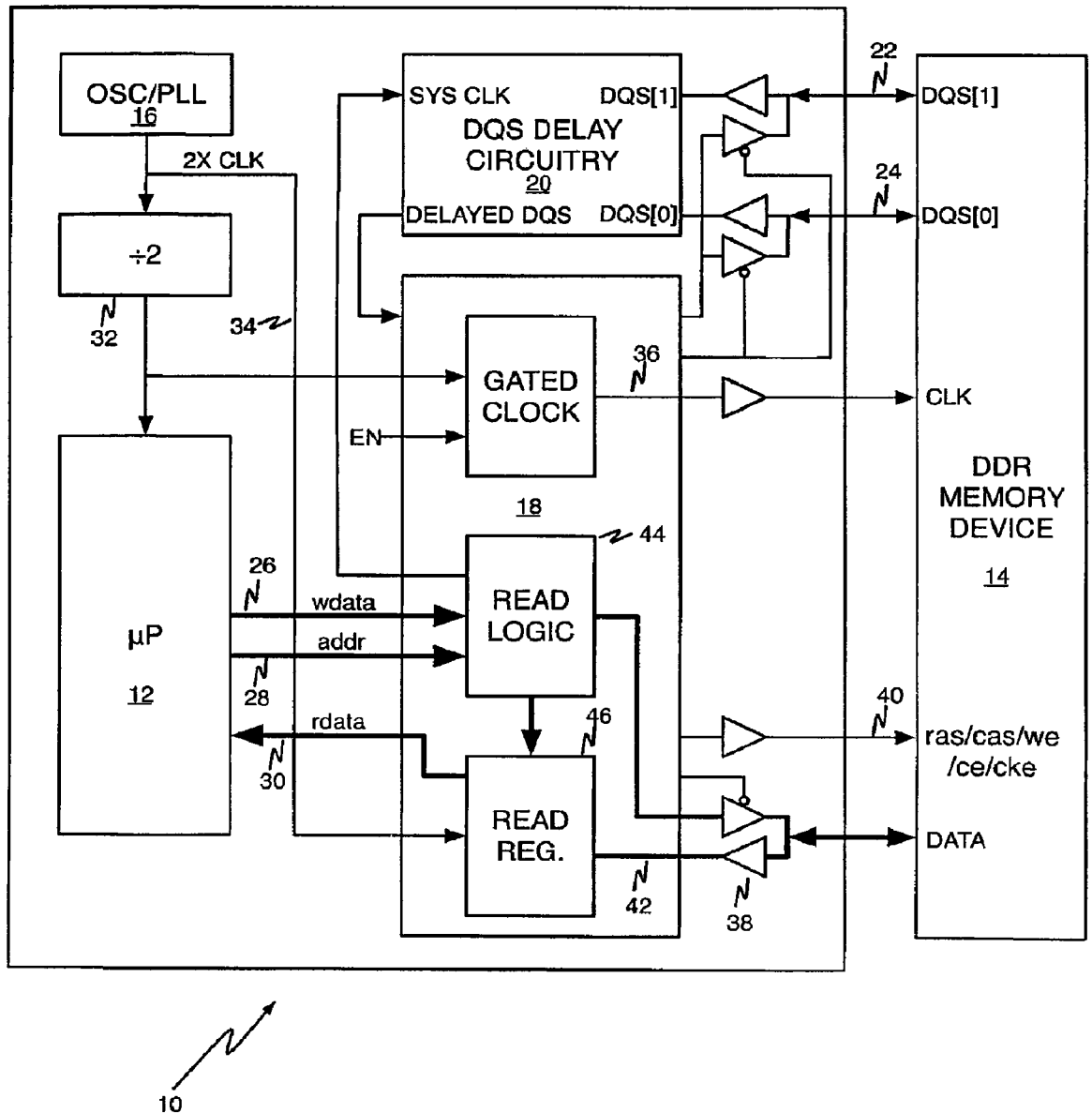
FIG. 1 is a block diagram of a typical microcontroller system in which the present invention may be advantageously employed.
Figure 8:
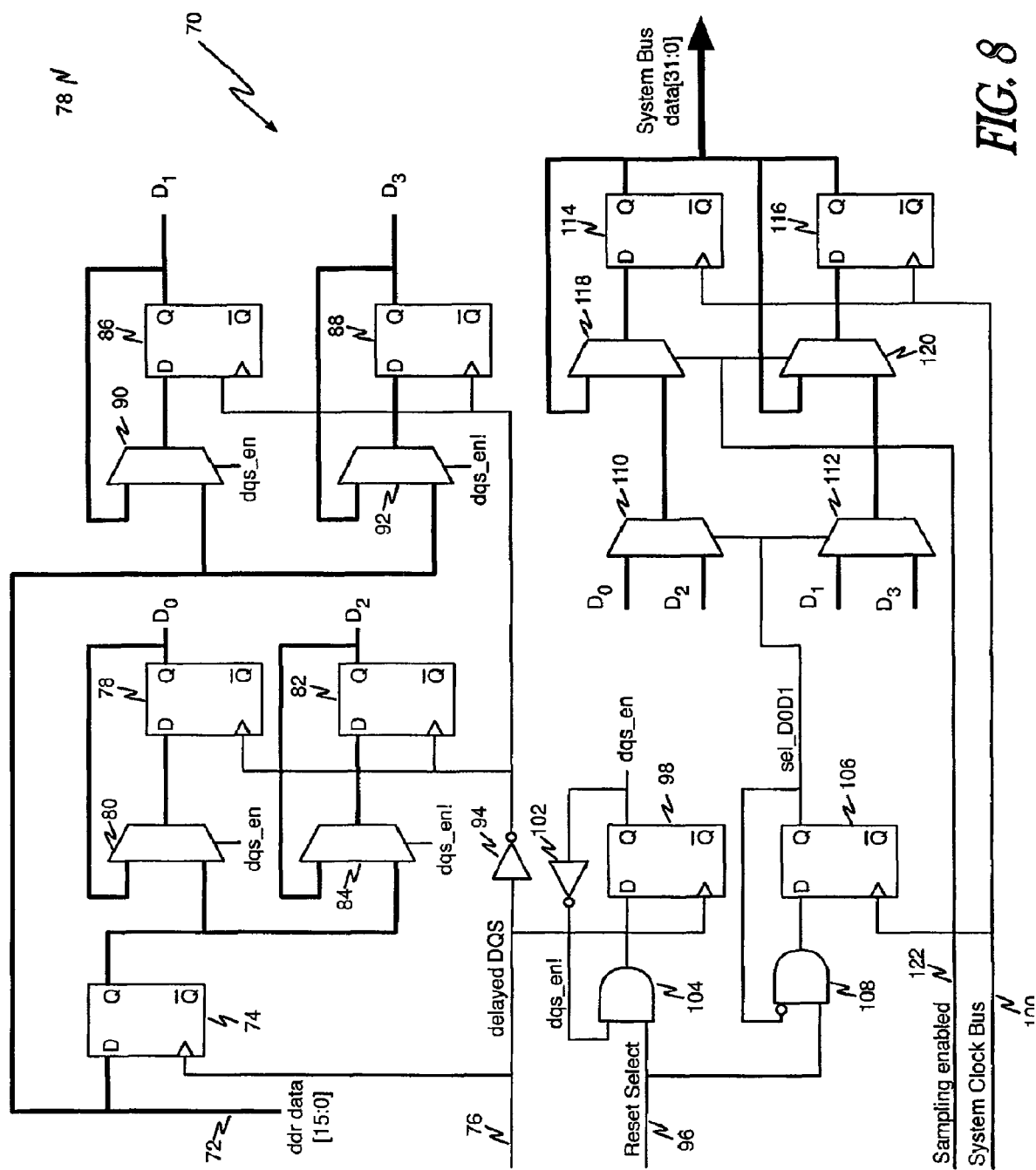
FIG. 8 is a block diagram of a read data stage logic configuration according to the present invention for use in a DDR memory controller such as that shown in FIG. 1.

Referring now to FIG. 8, a block diagram shows a read data stage logic configuration according to the present invention for use in a DDR memory controller such as that shown in FIG. 1. Sixteen-bit DDR-SDRAM data is presented on lines 72. Capture DFF 74 captures the data on the rising edge of the delayed DQS signal on delayed DQS line 76. The output of capture DFF 74 is presented to capture DFF 78 through multiplexer 80 and to capture DFF 82 through multiplexer 84. The Q output of capture DFF 78 provides the D0 output and the Q output of capture DFF 82 provides the D2 output.

Capture DFFs 86 and 88 accept data from lines 72 through multiplexers 90 and 92, respectively. The Q output of capture DFF 86 provides the D1 output and the Q output of capture DFF 88 provides the D3 output. Multiplexers 80, 84, 90, and 92 allow data to be recirculated in DFFs 78, 82, 86, and 88. DFF 74 is clocked by the delayed DQS signal on line 76, and DFFs 78, 82, 86, and 88 are clocked by the delayed DQS signal on line 76 inverted in inverter 94.

Reset_sel on line 96 is a signal which is high when no read access is performed and which is cleared when a read access is started. When Reset_sel is set to logical "one," DFF 98, clocked by the delayed DQS on line 76, inverter 102, and AND gate 104 act as a divide-by-2 circuit providing waveform "dqs_en" at the output of DFF 98 that drives the select inputs of multiplexers 80 and 90 and the waveform "dqs_en!" at the output of inverter 102 that drives the select inputs of multiplexers 84 and 92. Similarly, DFF 106 clocked by the system clock on line 100, and AND gate 108 having an inverted input act as a divide-by-2 circuit that provides a "sel_D0D1" output at the Q output of DFF 106.

The D0 and D2 outputs from capture DFFs 78 and 82 drive the data inputs of multiplexer 110 and the D1 and D3 outputs from capture DFFs 86 and 88 drive the data inputs of multiplexer 112. The select inputs of multiplexers 110 and 112 are driven by the "sel_D0D1" output of DFF 106.

The inputs to capture-data-register DFFs 114 and 116 are selected by means of multiplexers 118 and 120, respectively. The clock inputs of DFFs 114 and 116 are both driven by system clock bus 100. Multiplexers 118 and 120 are required to hold the data value on the system bus at the combined outputs of capture data DFFs 114 and 116 by recirculating the outputs of DFFs 114 and 116 when the input "sampling_enabled" on line 122 is not active.

By employing multiplexers 80, 84, 90 and 92 to re-circulate data into respective DFFs 78, 82, 86, and 88, under the control of the two divide-by-two circuits, the data bus coming from DDR-SDRAM memory device is sampled every two DQS cycles. This provides a longer data stability period and therefore allows accommodation of a greater operating frequency range.

Figure 2:
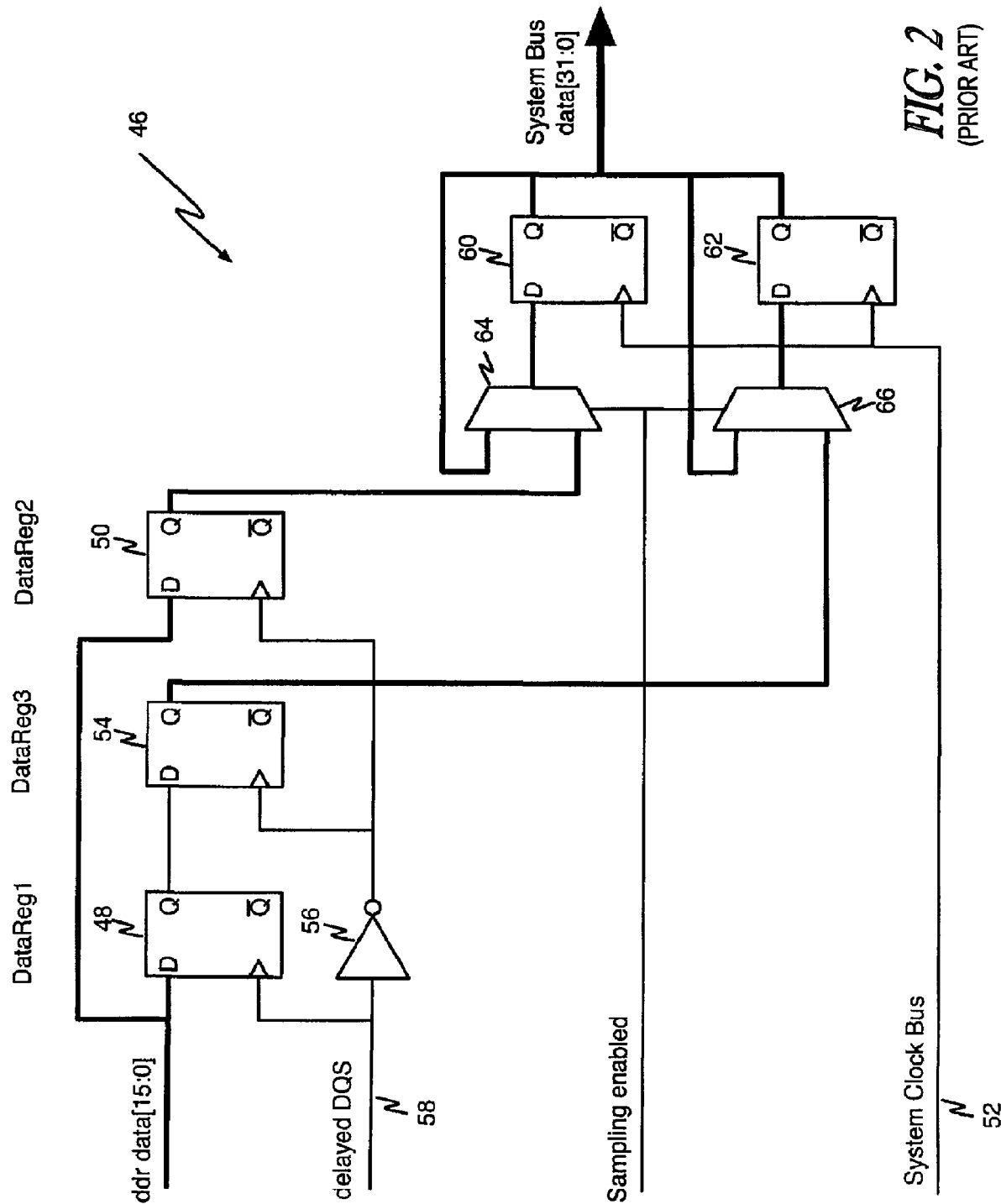
FIG. 2 is a block diagram showing a possible read data stage logic configuration for use in a DDR memory controller such as that shown in FIG. 1.
Figure 3:
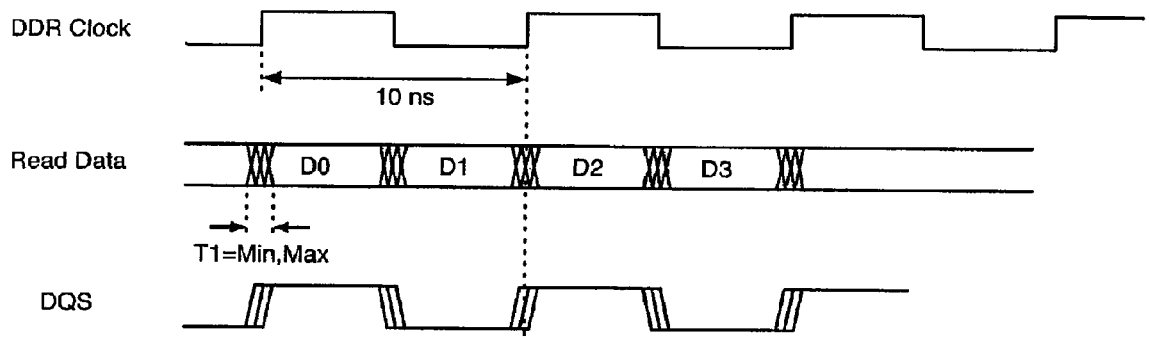
FIG. 3 is a timing diagram showing the read timing of a typical standard DDR-SDRAM.
Figure 4:
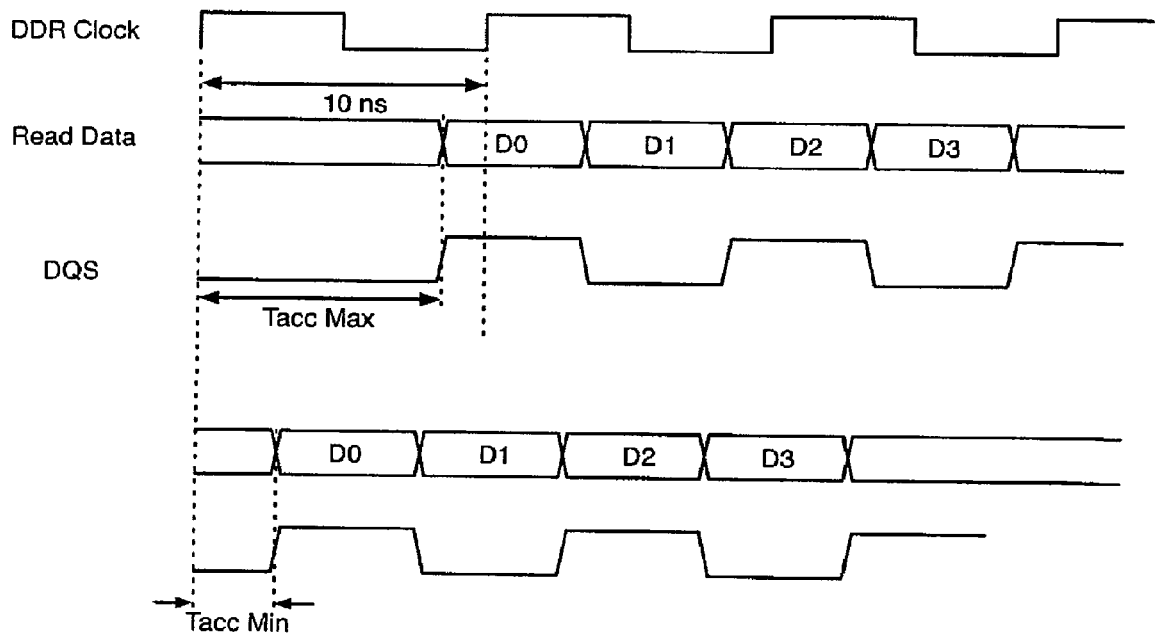
FIG. 4 is a timing diagram showing the read timing of a typical mobile DDR-SDRAM.
Figure 5:
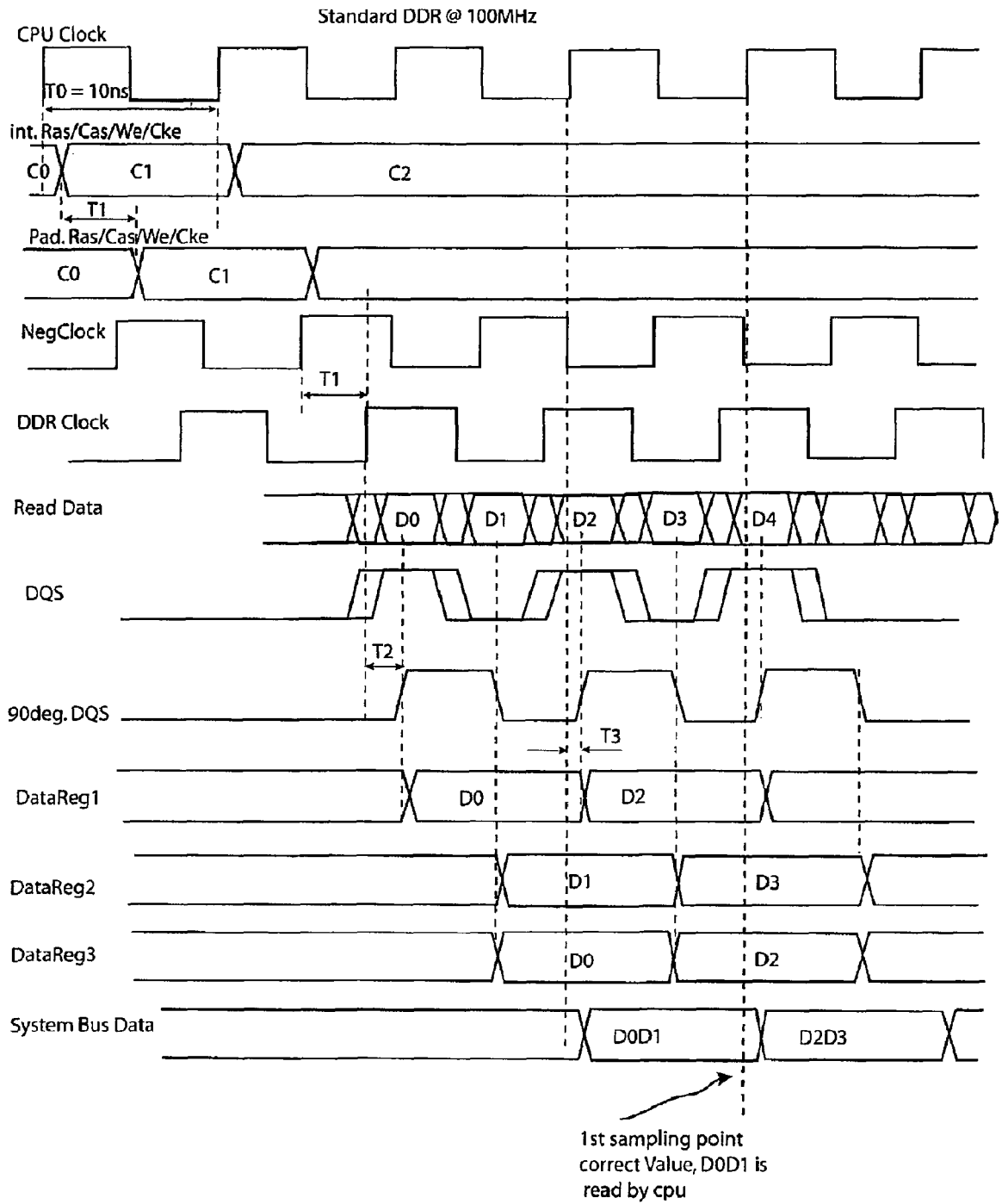
FIG. 5 is a series of timing diagrams that illustrate the operation of the circuit of FIG. 2 for a standard DDR-SDRAM memory device under best-case and worst-case conditions.
Figure 9:
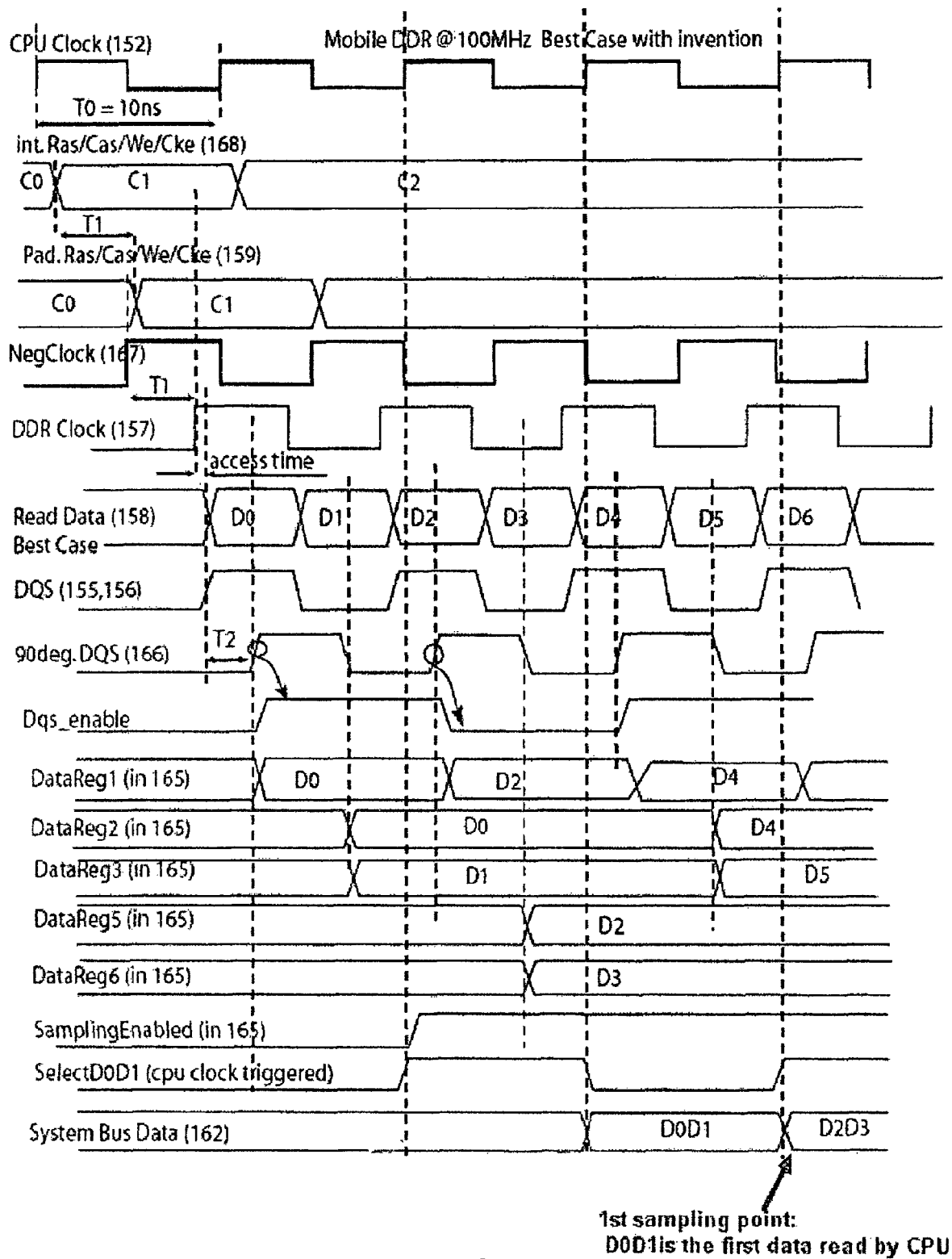
FIG. 9 is a series of timing diagrams that illustrate the operation of the circuit of FIG. 8 for a mobile DDR-SDRAM memory device under a best-case operating condition.

Referring now to FIG. 9, a series of timing diagrams illustrate the operation of the circuit of FIG. 8 for a mobile DDR-SDRAM memory device under a best-case operating condition. From an examination of FIG. 9, the difference between the location of the first sampling point achieved by employing the prior-art circuit of FIG. 2 and the location of the first sampling point achieved by employing the circuit of FIG. 8 can be seen in the bottom trace.

Figure 10:
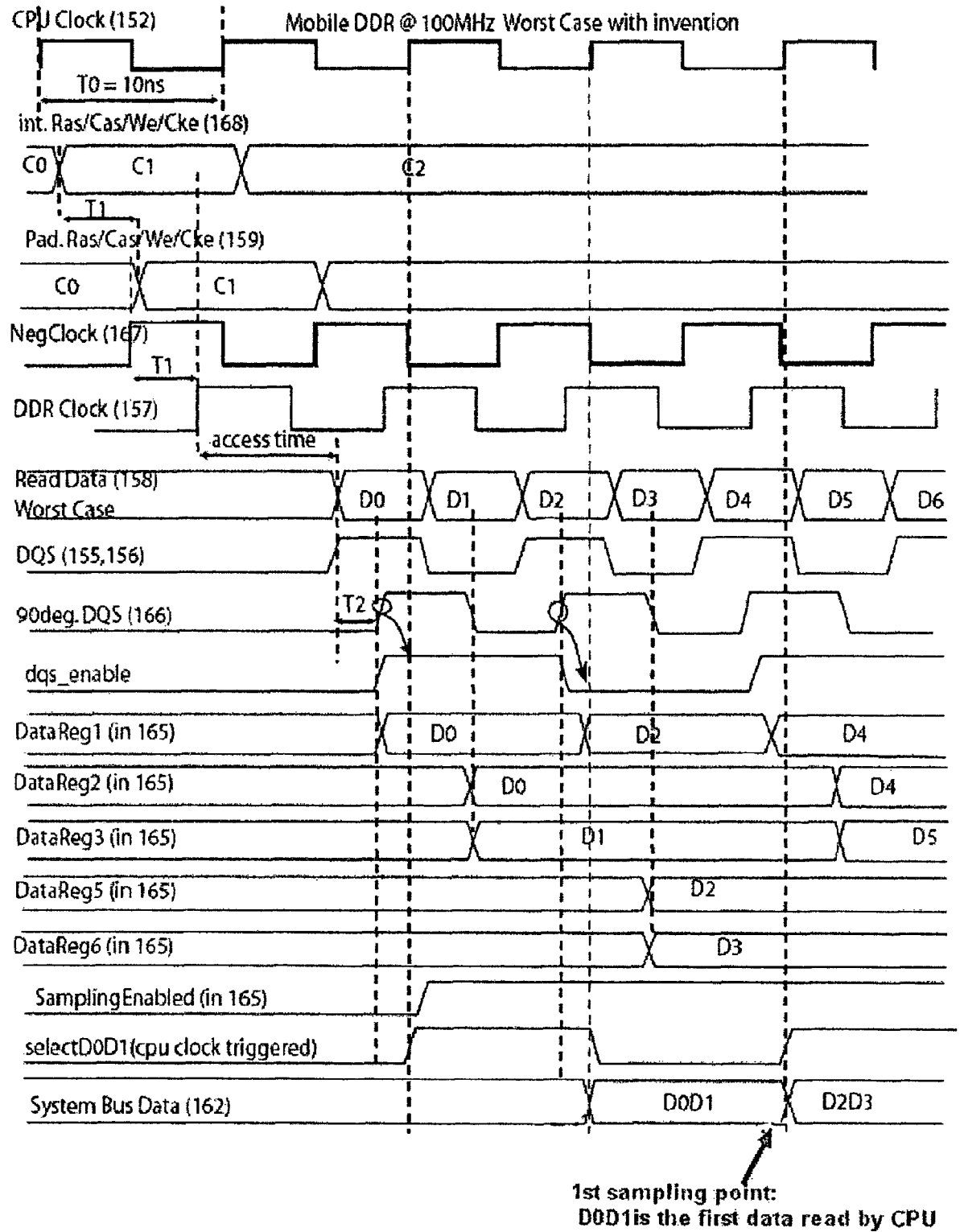
FIG. 10 is a series of timing diagrams that illustrate the operation of the circuit of FIG. 8 for a mobile DDR-SDRAM memory device under a worst-case operating condition.

Referring now to FIG. 10, a series of timing diagrams illustrate the operation of the circuit of FIG. 8 for a mobile DDR-SDRAM memory device under a worst-case operating condition. From an examination of FIG. 10, the difference between the location of the first sampling point achieved by employing the prior-art circuit of FIG. 2 and the location of the first sampling point achieved by employing the circuit of FIG. 8 can be seen in the bottom trace. Unlike the case with the circuit of FIG. 8, the increased access time for the mobile DDR-SDRAM memory device does not adversely affect the data capture due to the increased data stability over two clock cycles instead of one as provided in the system of FIG. 2.

Figure 11:
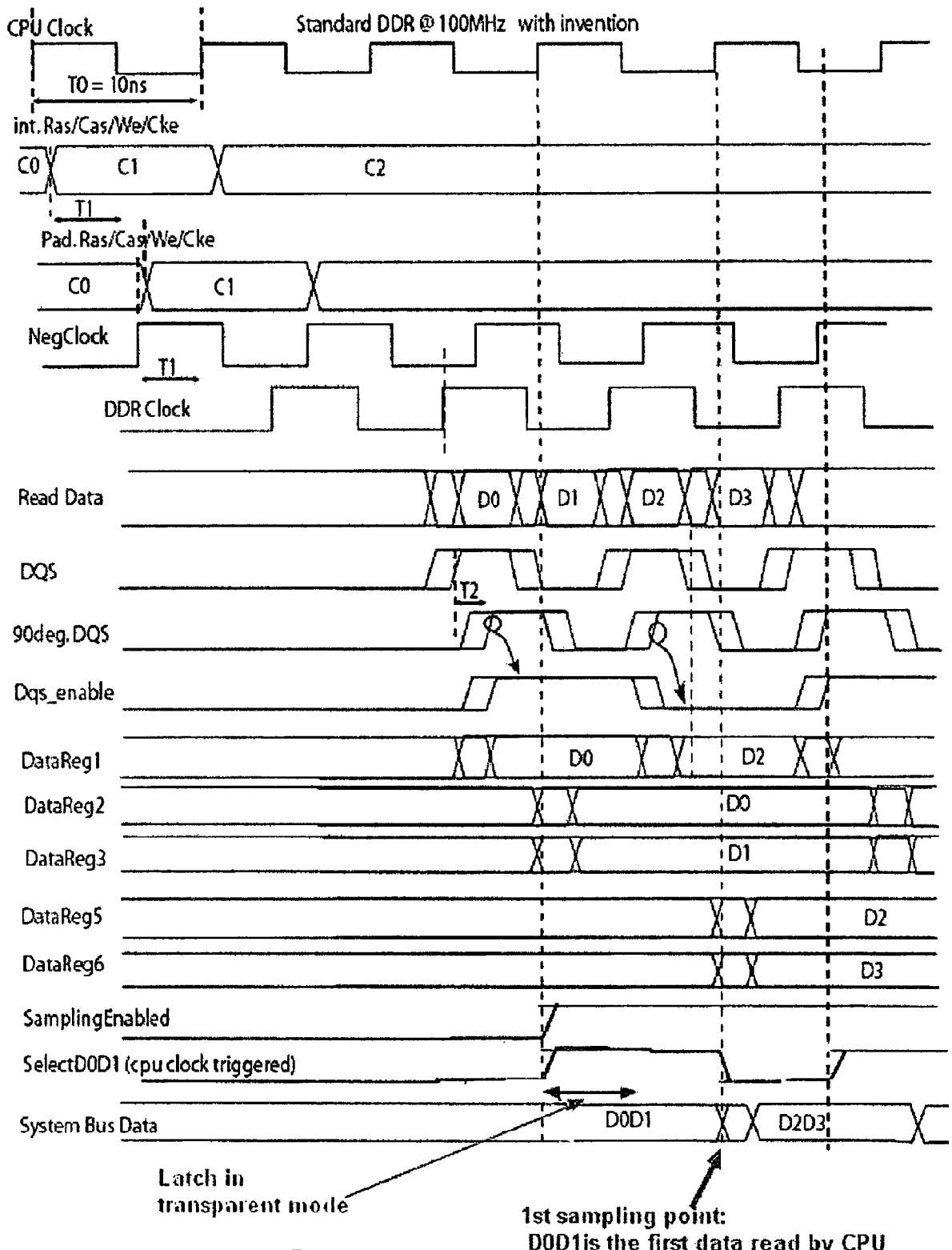
FIG. 11 is a series of timing diagrams that illustrate the operation of the circuit of FIG. 12 and FIG. 8 for a standard DDR-SDRAM memory device under best-case and worst-case operating conditions.

Referring now to FIG. 11, a series of timing diagrams illustrate the operation of the circuit of FIG. 8 for a standard DDR-SDRAM memory device under best-case and worst-case operating conditions. The first data sampling point shown in the bottom trace occurs later in time than it would using the circuit of FIG. 2.

Propagation delay is due to the data PAD propagation delay or propagation delay of feedback data logic in the circuit embedding the memory controller. To avoid any capture errors in best-case operating conditions if the propagation delay is significant (equal or greater than half the clock period) a modification may be made in the circuitry of FIG. 8.

Figure 12:
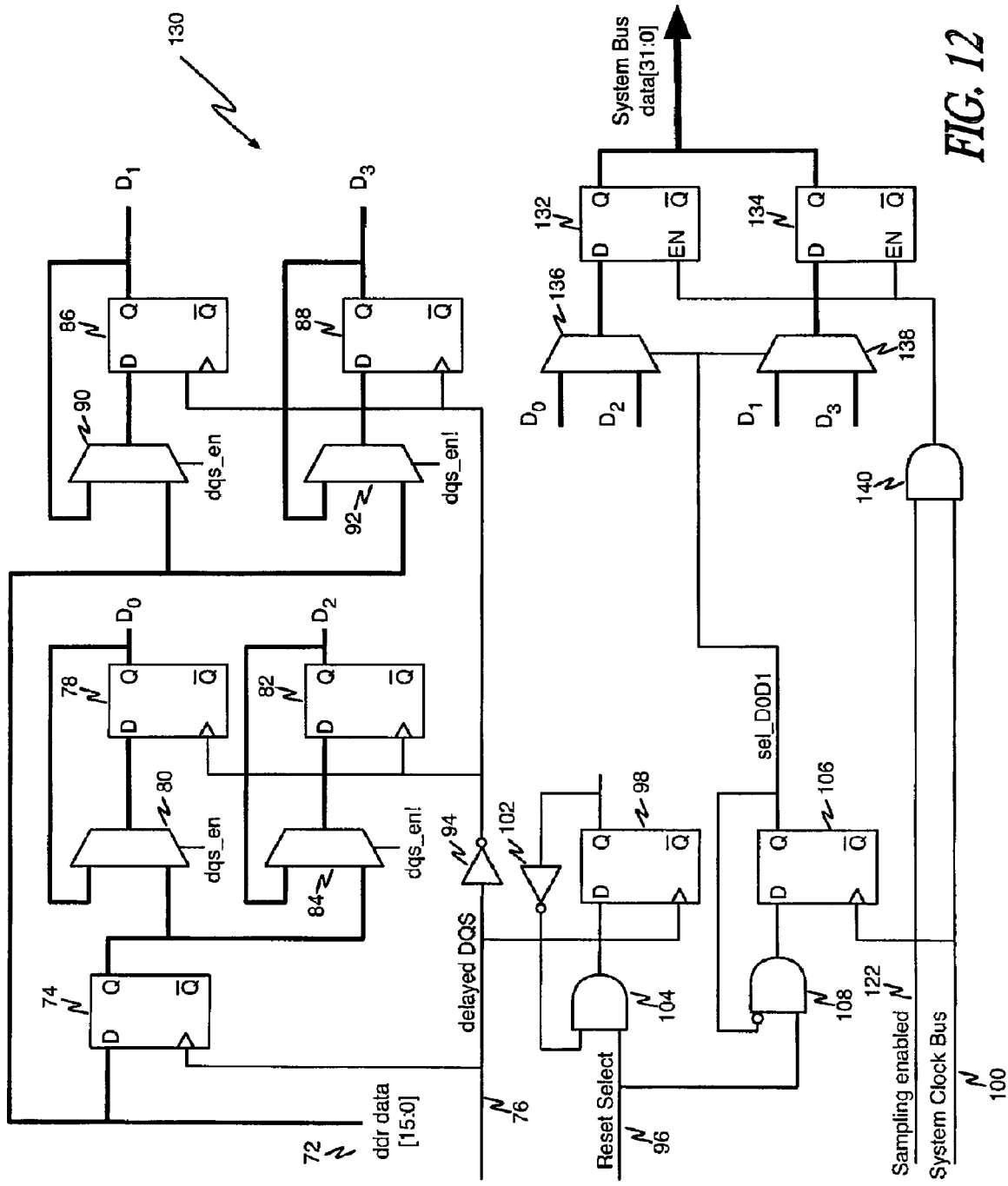
FIG. 12 is a block diagram of an alternative read data stage logic configuration according to the present invention for use in a DDR memory controller such as that shown in FIG. 1.

Referring now to FIG. 12, a block diagram shows an alternative read data stage logic configuration according to the present invention for use in a DDR memory controller such as that shown in FIG. 1. The circuit is substantially similar to the circuit shown in FIG. 8. In the description of the embodiment of FIG. 12, elements corresponding to elements present in FIG. 8 will be referred to using the same reference numerals used in FIG. 8.

In the circuit shown in FIG. 12, sixteen-bit DDR-SDRAM data is presented on lines 72. The operation of the circuit of FIG. 12 is generally similar to that of the circuit of FIG. 8.

In FIG. 12, the D0 and D2 outputs from capture DFFs 78 and 82 drive the data inputs of multiplexer 136 and the D1 and D3 outputs from capture DFFs 86 and 88 drive the data inputs of multiplexer 138. The select inputs of multiplexers 136 and 138 are driven by the sel_D0D1 output of DFF 106.

In FIG. 12, the inputs to capture-data-register data latches 132 and 134 are selected by means of multiplexers 136 and 138, respectively. The clock inputs of capture-data-register data latches 132 and 134 are both driven by the output of AND gate 140, having one input driven by system clock bus 100 and the other input driven by sampling_enabled line 122.

By employing multiplexers 80, 84, 90, and 92 to re-circulate data into respective DFFs 78, 82, 86, and 88, under the control of the two divide-by-two circuits, the data bus coming from DDR-SDRAM memory device is sampled every two DQS cycles.

Figure 13:
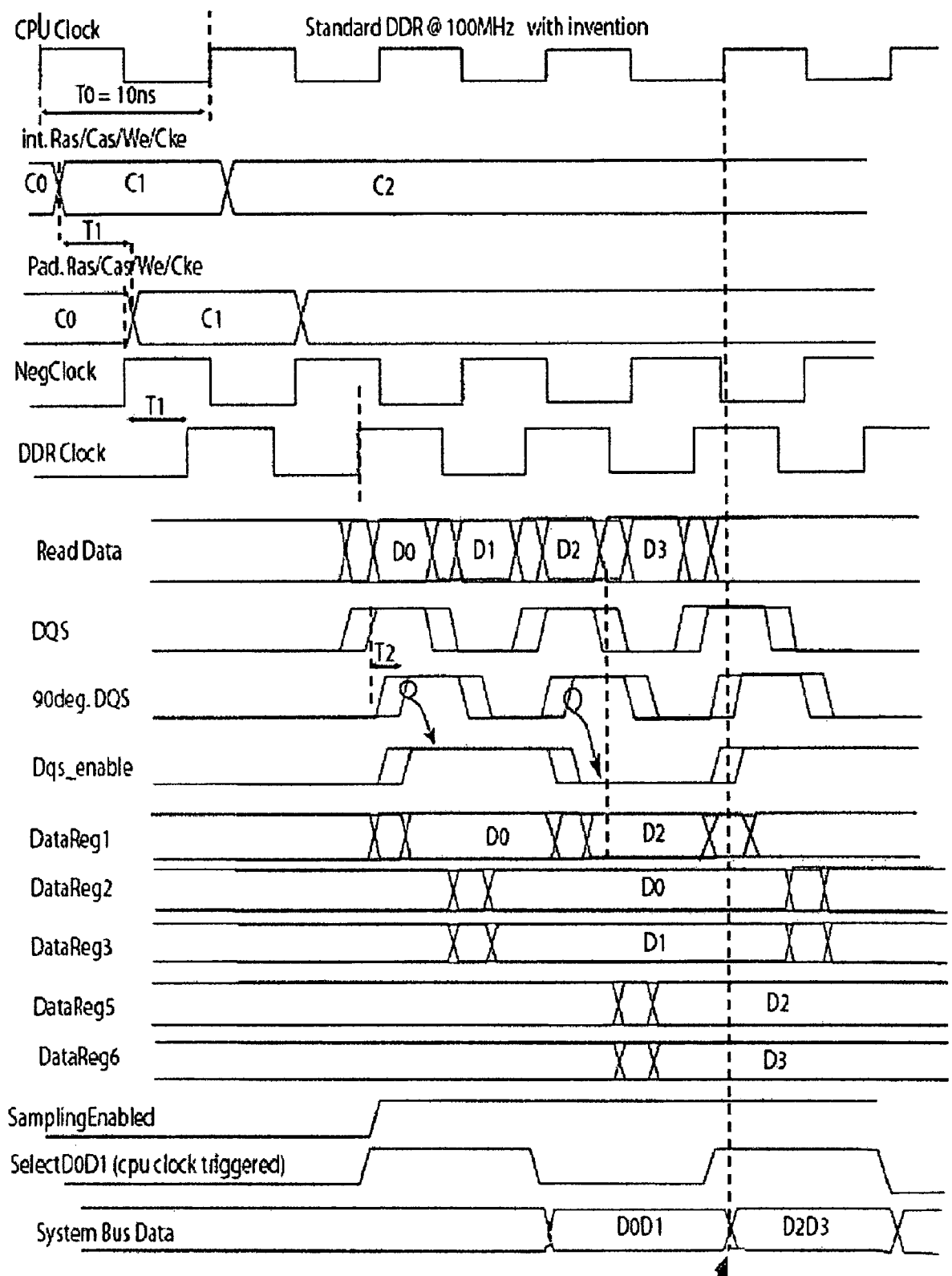
FIG. 13 is a series of timing diagrams that illustrate the operation of the circuit of FIG. 8 and FIG. 12 for a standard DDR-SDRAM memory device under best-case and worst-case operating conditions.

The signal traces associated with the circuit of FIG. 12 are shown in FIG. 13. As shown in the last trace of FIG. 13, the sampling point is the same that shown in FIG. 11. This is done by the logic driving the signal "sampling Enabled" on line 122 and "reset_sel" on line 96.

In the traces shown in FIG. 13, it can be seen that delay T3 is reduced as the propagation delay increases in the clock PAD buffer. T3 may be reduced by other propagation delays, such as DDR data arriving late compared to the DQS signal, the data feedback logic delay including the PAD propagation delay due to input mode buffer 38 of FIG. 1, or the propagation delay of the DFFs of FIG. 2 if this net is buffered for design rules. Therefore there is a risk that T3 will violate the setup time of a DFF if the circuit of FIG. 8 is used, but in the circuit of FIG. 13 the latch remains opened for the high-level period of the clock, and there is no problem with the setup margin.

Figure 6:
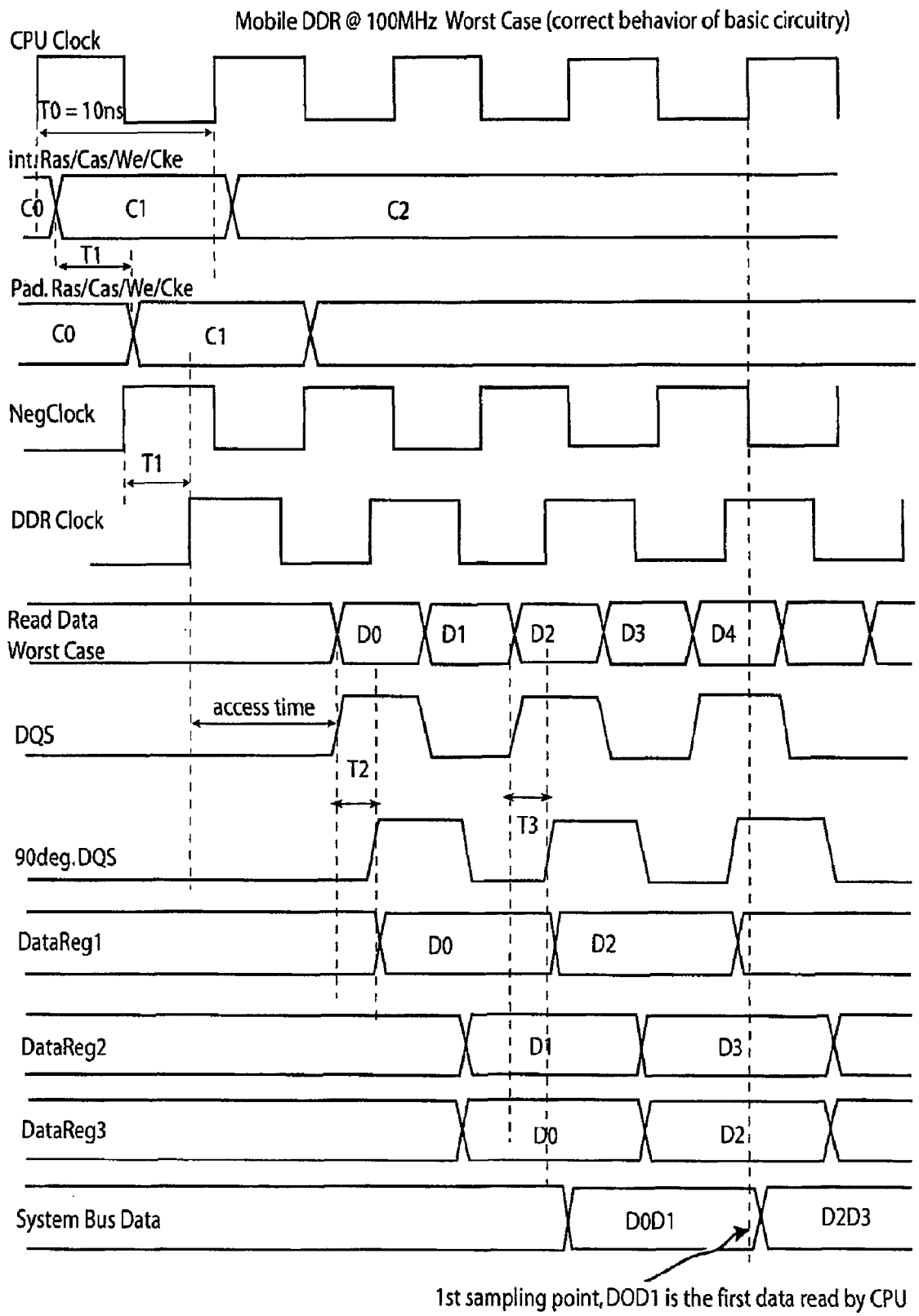
FIG. 6 is a series of timing diagrams that illustrate the operation of the circuit of FIG. 2 for a mobile DDR-SDRAM memory device under a worst-case operating condition.
Figure 7:
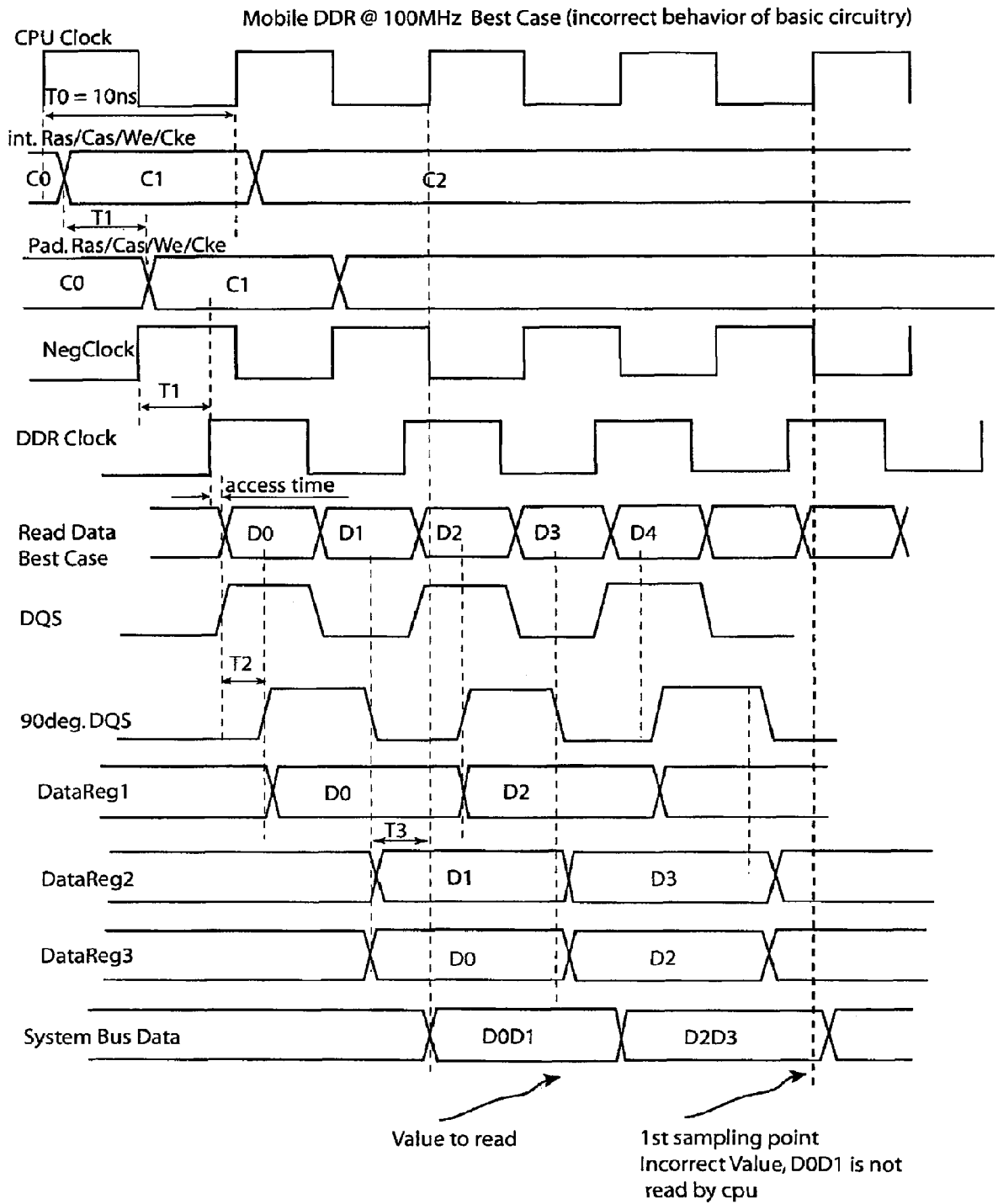
FIG. 7 is a series of timing diagrams that illustrate the operation of the circuit of FIG. 2 for a mobile DDR-SDRAM memory device under a best-case operating condition.

The present invention solves the problem of driving both mobile and standard DDR-SDRAM memory devices without any need to employ a data FIFO. The number of data capture registers is increased and each of them samples every two clock cycles compared with sampling each clock cycle in prior-art architectures. The first sampling point is delayed by one clock cycle compared to the prior-art architecture. Even if delayed by one clock cycle in prior-art architectures, the problem would not have been solved because the worst-case timing would operate correctly but the best-case timing would not operate correctly since the first data would be lost and the data sequence would start with D2D3 instead of D0D1 as shown in FIG. 6.

The capture registers are sampling read data once every two clock cycles, therefore they are holding data for two clock cycles. Therefore, whatever the access time of the DDR-SDRAM memory device (assuming it is not greater than one clock cycle) the data held by the capture registers can be sampled in a safe way because two clock cycles of stability is greater than one clock cycle of access time variance. To have the correct data sequence on the system bus, the selection of the capture registers have to be switched every clock cycle. The number of sample registers is double and each set of registers samples DDR data during a different clock cycle from the other set. The selection between each set of registers is switched every clock cycle as can be seen in FIG. 11.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A circuit for sampling data from a memory device comprising:
   a circuit for providing a clock signal to the memory device;
   a data bus carrying data at twice the rate of the clock signal;
   a circuit for providing a control signal to indicate the period of time where data are valid;
   a set of registers whose content is triggered by both edges of a signal resulting from the delay of the control signal;
   the set of registers being divided into several sub-parts, each sub-part loading the value of the data bus carrying data provided by the memory device at a period being an integer multiple of the clock signal where the sampling point is different for each sub-part; and
   a set of output registers triggered by the clock signal, the set of output registers coupled to the set of registers to provide data from the set of registers to a system bus.

2. The circuit of claim 1 wherein the memory device is a DDR-SDRAM memory device.

3. The circuit of claim 1 wherein the memory device is a mobile DDR-SDRAM memory device.

4. The circuit of claim 1 wherein the memory device is a mobile DDR-SDRAM memory device and data from a DDR-SDRAM, the selection of memory device being performed by a configuration register.

5. The circuit of claim 1 where the circuit driving the memory device is a microcontroller.

6. The circuit of claim 1 wherein the set of registers comprises data flip-flops.

7. The circuit of claim 1 wherein the set of registers comprises data latches.

8. A circuit for sampling data from a memory device comprising:
   a circuit for providing a clock signal;
   a data bus carrying data at twice the rate of the clock signal;
   a circuit for providing a control signal to indicate the period of time where data are valid;
   a set of registers coupled to the data bus, whose content is triggered by both edges of a signal resulting from delay of the control signal;
   the set of registers being divided into sets of sub-parts, a first set of sub-parts being coupled to receive data corresponding to a first clock cycle and a second set of sub-parts being coupled to receive data corresponding to a second clock cycle, each sub-part loading different portions of data on the data bus;
   each sub-part holding the data for at least two clock cycles; and
   a set of output registers triggered by the clock signal, the set of output registers coupled to the set of registers to provide data from the set of registers to a system bus.

9. The circuit of claim 8 wherein each sub-part is a sub-part register having an output and a multiplexor with an input coupled to the output of the sub-part register and an output coupled to an input of the sub-part register.

10. The circuit of claim 9 wherein each sub-part register is coupled to receive an inverse of the delay of the control signal.

11. The circuit of claim 9 and further comprising a circuit to receive a reset-select signal and provide a signal to control the multiplexors coupled to the sub-part registers.

12. The circuit of claim 11 wherein the circuit to receive the reset-select signal is coupled to the delayed control signal.

13. A circuit for sampling data from a memory device comprising:
   a circuit for providing a clock signal;
   a data bus carrying data at twice the rate of the clock signal;
   a circuit for providing a control signal to indicate the period of time where data are valid;
   a set of registers whose content is triggered by both edges of a signal resulting from delay of the control signal;
   the set of registers being divided into several sub-part registers, each sub-part register loading the value of the data bus carrying data provided by the memory device at a period being an integer multiple of the clock signal where the sampling point is different for each sub-part register, each sub-part register having a multiplexor coupled to re-circulate the value of the data bus stored in the sub-part register; and
   a set of output registers coupled to multiplexors that receive outputs from the sub-part registers and re-circulate their corresponding outputs.

14. The circuit of claim 13 and further comprising a set of output multiplexors coupled to the output registers to multiplex the sub-part register outputs.

15. The circuit of claim 14 and further comprising a circuit to receive a reset-select signal and provide a signal to control the multiplexors coupled to the sub-part registers and to control the output multiplexors responsive to the reset-select signal.

16. The circuit of claim 13 wherein the output registers are triggered by the clock signal.

* * * * *